(12) United States Patent
Kim et al.

(10) Patent No.: US 9,236,448 B2
(45) Date of Patent: Jan. 12, 2016

(54) METHOD FOR ACHIEVING VERY SMALL FEATURE SIZE IN SEMICONDUCTOR DEVICE BY UNDERTAKING SILICIDE SIDEWALL GROWTH AND ETCHING

(75) Inventors: Eunha Kim, Palo Alto, CA (US); Minh-Van Ngo, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1304 days.

(21) Appl. No.: 12/231,369

(22) Filed: Sep. 2, 2008

(65) Prior Publication Data

US 2010/0055907 A1 Mar. 4, 2010

(51) Int. Cl.
| | |
|---|---|
| H01L 21/302 | (2006.01) |
| H01L 29/66 | (2006.01) |
| H01L 21/28 | (2006.01) |
| H01L 21/8234 | (2006.01) |

(52) U.S. Cl.
CPC ...... *H01L 29/66659* (2013.01); *H01L 21/2815* (2013.01); *H01L 21/823437* (2013.01); *H01L 21/823418* (2013.01); *H01L 29/6653* (2013.01)

(58) Field of Classification Search
CPC ............ H01L 21/2815; H01L 29/66659; H01L 21/823437; H01L 21/823418; H01L 29/6653
USPC ............ 438/692, 763, 199; 257/E21.214
See application file for complete search history.

(56) References Cited

U.S. PATENT DOCUMENTS

| | | | | |
|---|---|---|---|---|
| 6,124,177 | A * | 9/2000 | Lin et al. | 438/305 |
| 6,841,449 | B1 * | 1/2005 | Bertrand et al. | 438/299 |
| 2003/0207565 | A1 * | 11/2003 | Tan et al. | 438/664 |
| 2005/0079730 | A1 * | 4/2005 | Beintner et al. | 438/758 |
| 2005/0176227 | A1 * | 8/2005 | Wu et al. | 438/592 |
| 2006/0189061 | A1 * | 8/2006 | Amos et al. | 438/199 |
| 2006/0211260 | A1 * | 9/2006 | Tran et al. | 438/763 |
| 2006/0240361 | A1 * | 10/2006 | Lee et al. | 430/313 |
| 2006/0252203 | A1 * | 11/2006 | Chien et al. | 438/257 |

* cited by examiner

*Primary Examiner* — Duy Deo
*Assistant Examiner* — Mahmoud Dahimene

(57) ABSTRACT

In the present method of fabricating a semiconductor device, initially, a semiconductor substrate is provided. An oxide layer is provided on and in contact with the substrate, and a polysilicon layer is provided on and in contact with the oxide layer. A layer of photoresist is provided on the polysilicon layer, and the photoresist is patterned to provide a photoresist body, which is used as a mask to etch away polysilicon and oxide, forming a polysilicon element thereunder. The photoresist body is then removed. A nickel layer is provided on the resulting structure, and a reaction step is undertaken to provide that nickel diffuses into the exposed top and side portions of the polysilicon body, forming nickel silicide. After the reaction step, the remaining nickel is removed, and a chemical-mechanical polishing step is undertaken to remove nickel silicide so that a pair of nickel silicide bodies remain, separated by polysilicon. Using the nickel silicide bodies as masks, the polysilicon and oxide thereunder are etched away.

28 Claims, 5 Drawing Sheets

METHOD FOR ACHIEVING VERY SMALL FEATURE SIZE IN SEMICONDUCTOR DEVICE BY UNDERTAKING SILICIDE SIDEWALL GROWTH AND ETCHING

BACKGROUND OF THE INVENTION

1. Field of the Invention

This invention relates generally to semiconductor device manufacture, and more particularly, to a method of achieving very small feature size of such a device.

2. Discussion of the Related Art

FIGS. 1-3 illustrate a conventional method for forming a feature, for example, a gate, of a MOSFET transistor. As shown (FIG. 1), a semiconductor, for example silicon, substrate 20 is provided. A thin oxide layer 22 is grown on the substrate 20, and a layer of polysilicon 24 is deposited on the oxide layer 22. A layer of photoresist 26 is then provided on and in contact with the polysilicon layer 24. Using well-known lithographic techniques, the layer of photoresist 26 is then patterned (FIG. 2) to form a photoresist body 26A on the polysilicon layer 24. Using the photoresist body 26A as a mask, the unmasked polysilicon and oxide are etched away (FIG. 3), forming gate oxide 22A on and in contact with the substrate 20 and polysilicon gate 24A on and in contact with the gate oxide 22A. The photoresist body 26A is then removed, and further processing steps are undertaken as is well known to form a transistor including gate oxide 22A and gate 24A.

In etching, the width of the gate 24A is determined by the width of the photoresist body 26A. That is, if the photoresist body 26A has a width A as shown, the width of the resulting polysilicon gate 24A subsequent to the etching step will be substantially equal to the dimension A. As is well known, there is continuing interest in scaling down features sizes in semiconductor devices. It will therefore be understood that reduction in the width, i.e., dimension A of the photoresist body 26A, is highly desirable, so that the width of the formed polysilicon gate 24A is in turn reduced.

In patterning the photoresist 26 to provide a desired small dimension A, incorporating current lithographic technology, a light source of very short (for example 193 nm) wave length is used, resulting in the capability of providing a dimension A of the photoresist body 26A as small as 32 nm. However, in attempting to reduce the dimension A of the photoresist body 26A to less than 32 nm, optical interference problems arise which severely limit the ability to achieve such reduction. This in turn of course limits the ability to reduce the corresponding feature size, i.e., dimension A of the formed gate 24A.

While the example shown and described relates to the formation of a gate of a transistor, it will be understood that this problem exists for other portions of a semiconductor device wherein photoresist is used for patterning thereof.

Therefore, what is needed is a method for overcoming the above-cited problems so that feature size in a semiconductor device can be reduced.

SUMMARY OF THE INVENTION

Broadly stated, the present invention is a method of fabricating an electronic device comprising providing first and second bodies, the second body comprising first and second portions, the second portion extending further into the first body than the first portion, removing the first portion of the second body, with at least a part of the second portion of the second body remaining, and removing material of the first body using the second portion of the second body as a mask.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment! when read in conjunction with the accompanying drawings, wherein:

DETAILED DESCRIPTION

Reference is now made in detail to a specific embodiment of the present invention which illustrates the best mode presently contemplated by the inventors for practicing the invention.

Figure 1:
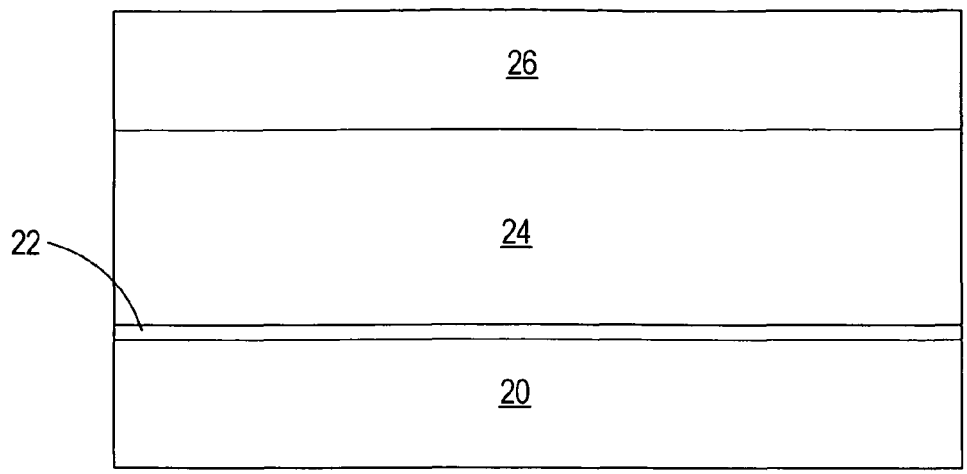
FIG. 1-3 illustrate a prior art approach in forming a gate of a transistor.
Figure 2:
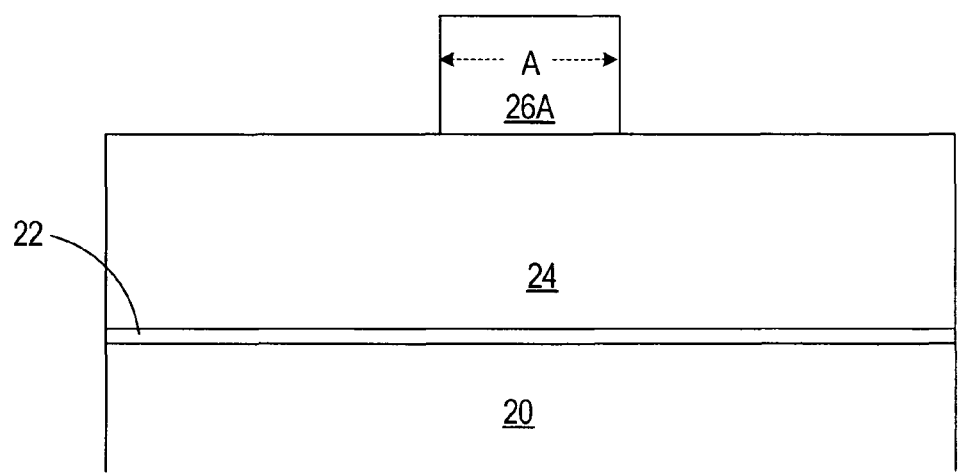
Figure 3:
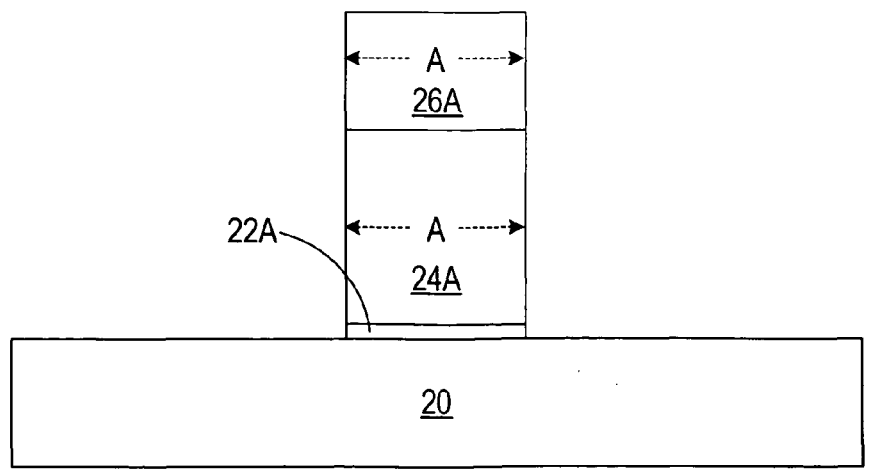
Figure 4:
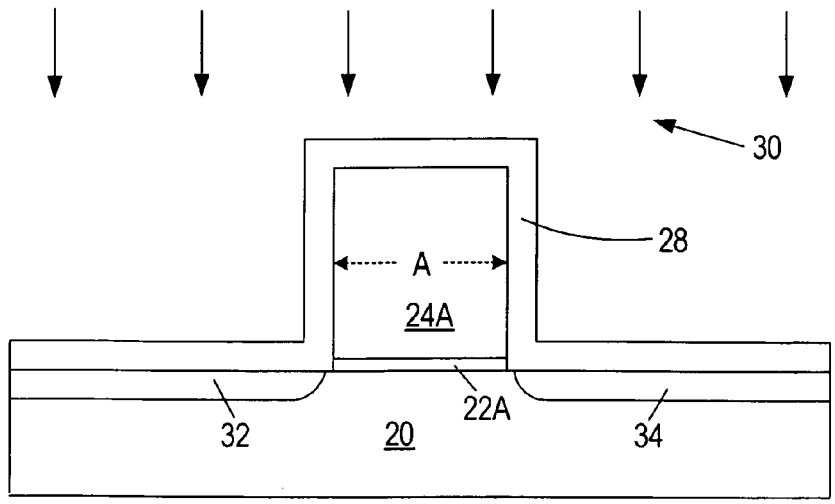
FIGS. 4-15 illustrate the present approach, wherein feature size of a formed gate is reduced as compared to the prior art.

Initially, the steps of FIGS. 1-3 are undertaken as shown and described above to form a polysilicon element 24A of width A, using patterned photoresist 26A as a mask. In the resulting device, as previously described, the polysilicon element 24A is on and in contact with gate oxide 22A, which is in turn on and in contact with substrate 20. Then, after removal of the photoresist body 26A, and with reference to FIG. 4, an oxide spacer layer 28 is grown on the resulting structure, covering the exposed portions of the substrate 20, gate oxide 22A, and polysilicon element 24A. An implant step 30 is then undertaken to form lightly doped regions 32, 34 in the substrate 20, this step also providing dopant in the polysilicon element 24A.

Figure 5:
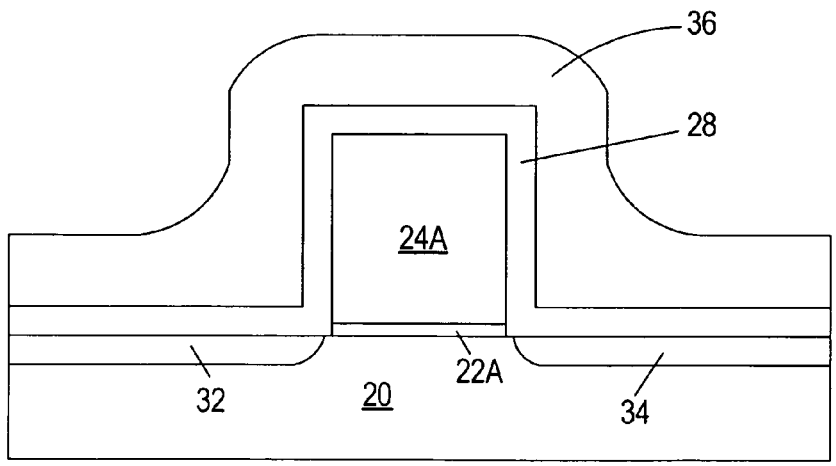
Figure 6:
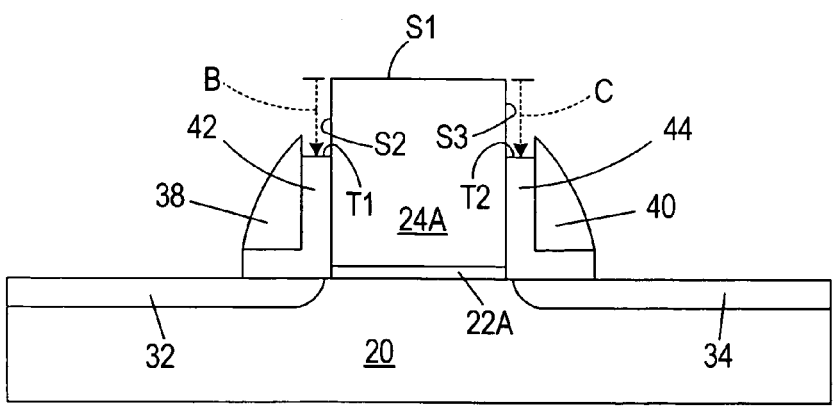

Next, and with reference to FIG. 5, a nitride layer 36 is deposited on the resulting structure. The nitride layer 36 is then etched to forms spacers 38, 40 (FIG. 6). An etching step of the oxide spacer layer 28 is then undertaken, removing portions of the oxide spacer layer 28 from the substrate 20, along with the portion of the oxide spacer layer 28 on the top of the polysilicon element 24A and portions of the oxide spacer layer 28 along the sides of the polysilicon element 24A. This step exposes the top surface S1 of the polysilicon element 24A and side surface portions S2, S3 of the polysilicon element 24A, and forms remaining oxide spacer layer portions 42, 44. This etching step of the oxide spacer layer 28 is undertaken so as to provide exposure of substantial portions of the side surfaces of the silicon element 24A, i.e., as shown, the depths of the exposed side surface portions S2, S3 from the top surface S1 of the polysilicon element 24A to the tops T1, T2 of the oxide spacer layer portions 42, 44 are shown by the dimensions B and C.

Figure 7:
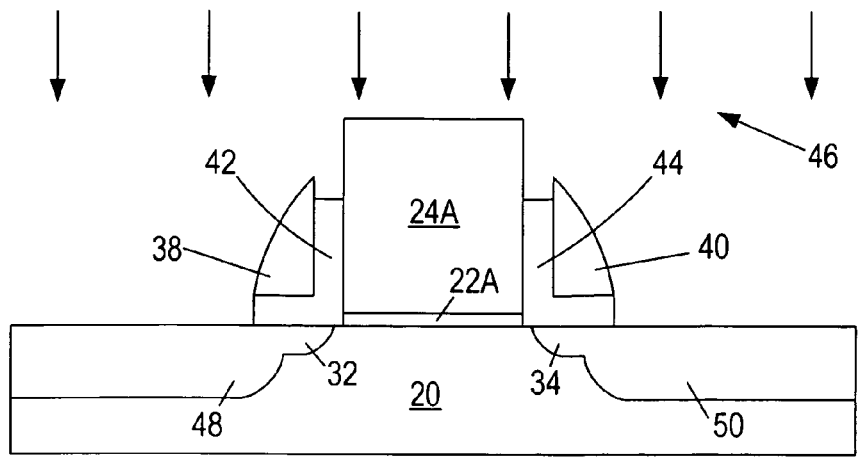

With reference to FIG. 7, an implant step 46 is then undertaken to form heavily doped regions 48, 50 in the substrate 20, also providing dopant in the polysilicon element 24A.

Next (FIG. 8), a metal layer, in this embodiment a nickel layer 52, is deposited over the resulting structure. Nickel of the nickel layer 52 is then reacted with polysilicon of the polysilicon element 24A and the exposed portions of the substrate 20 mainly by diffusion of nickel into silicon, forming NiSi silicide body 54 and NiSi silicide regions 56, 58. The unreacted nickel is then removed, and the remaining polysilicon body 24B has on and in contact therewith silicide body 54, the remaining polysilicon body 24B and silicide body 54 together forming structure 60 (FIG. 9).

Figure 8:
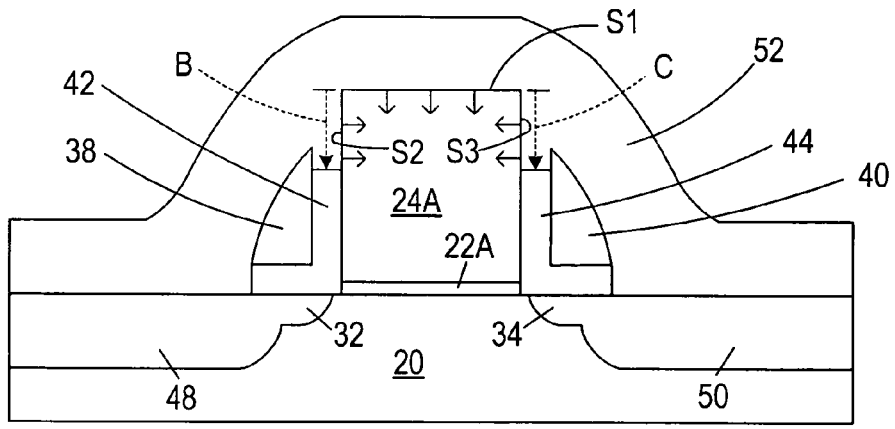
Figure 9:
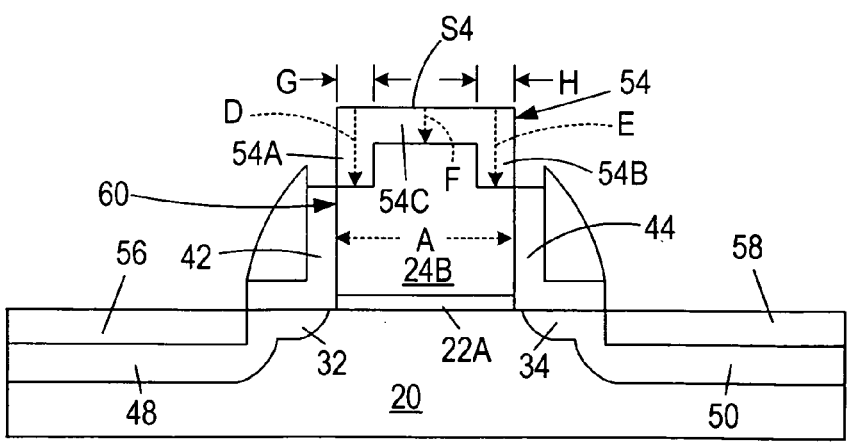

The diffusion of the nickel into the polysilicon element 24A takes place inward of the exposed side surfaces S2, S3 and inward of the top surface S1 thereof (see arrows in FIG. 8). Because of the substantial dimensions B and C, and because diffusion of nickel into polysilicon occurs substantially evenly inwardly of the side and the top surfaces, the resulting silicide body 54 has portions 54A, 54B which extend further into the structure 60 from the top surface S4 thereof than portion 54C which is between the portions 54A, 54B. These portions 54A, 54B have depths D and E which are substantially equal to the dimensions B and C shown and described, and which are substantially greater then the depth F of the portion 54C. As also noted, the widths G and H of the portions 54A, 54B are each substantially less than the width A of the remaining polysilicon body 24B.

Figure 10:
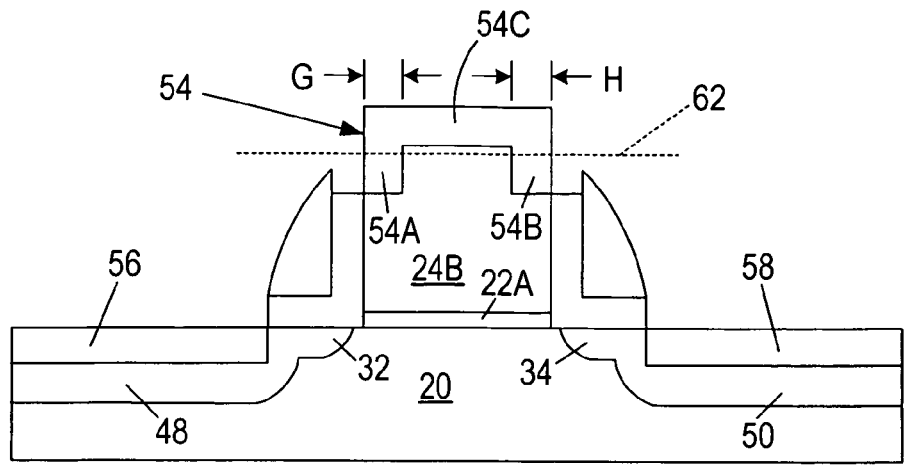
Figure 11:
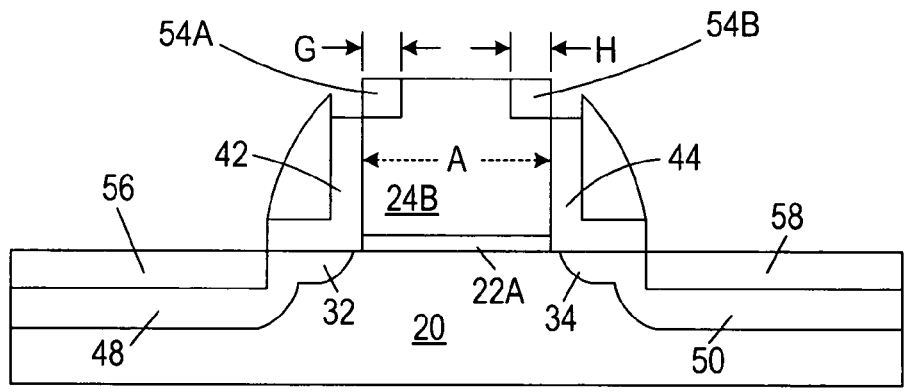

Next, and with reference to FIGS. 10 and 11, a chemical-mechanical planarization (CMP) step is undertaken down to the line indicated at 62, removing the entire silicide portion 54C (exposing the polysilicon thereunder), and parts of the silicide portions 54A, 54B, with at least parts of the silicide portions 54A, 54B remaining. This results in silicide portions 54A, 54B remaining on and in contact with the remaining polysilicon body 24B, separated by polysilicon therebetween, and, as noted previously, having respective widths G and H each of which is substantially less than the width A of the remaining polysilicon body 24B.

Figure 12:
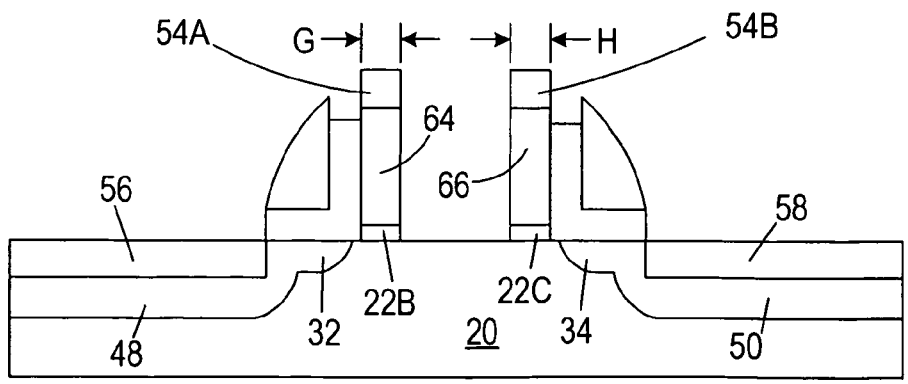
Figure 13:
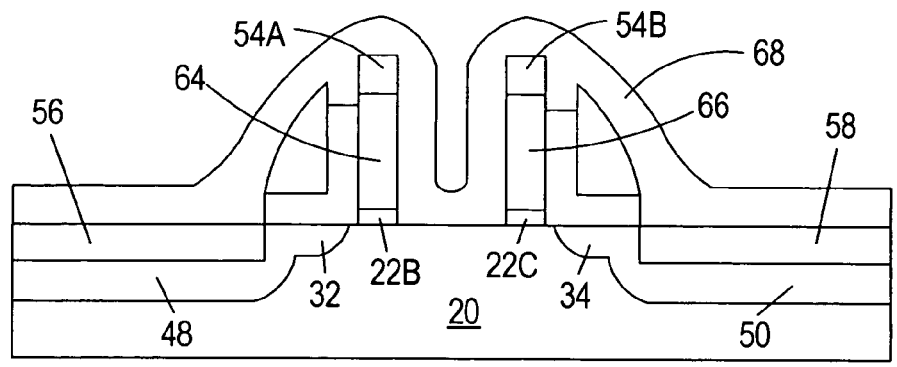
Figure 14:
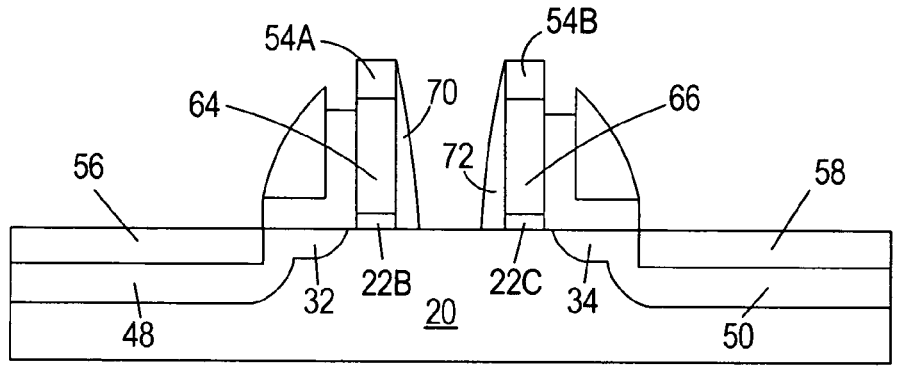
Figure 15:
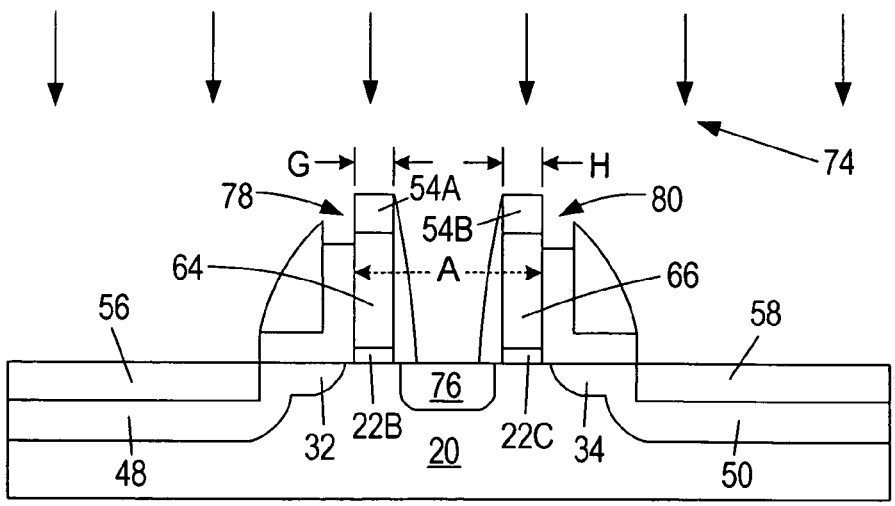

With reference to FIG. 12, some of the remaining polysilicon body 24B and oxide 22A are etched away, using the remaining silicide portions 54A, 54B as masks, forming polysilicon gates 64, 66, and remaining gate oxide portions 22B, 22C. A nitride layer 68 is then deposited on the resulting structure (FIG. 13), and is etched to form spacers 70, 72 (FIG. 14). An ion implantation step 74 is undertaken (FIG. 15) to form doped region 76. The doped region 32, 48, doped region 76, substrate 20, remaining gate oxide 22B, and polysilicon gate 64 form a transistor 78 having a gate width G, while the doped region 34, 50, doped region 76, substrate 20, remaining gate oxide 22C, and polysilicon gate 66 form a transistor 80 having a gate width H, with both dimension G and dimension H being substantially less than dimension A. The doped region 76 may, for example, act as a common source or drain for the transistors 78, 80. The remaining silicide portions 54A, 54B can be used for example as word lines, and to reduce gate resistance and access time.

It will be seen that the present approach is capable of providing polysilicon feature width of substantially less than dimension A, without relying on photolithography. It is also possible to further reduce such width by reducing the reaction time of the nickel with polysilicon, reducing the depth of the formed silicide inward of the side and top surfaces of the polysilicon.

It will be understood that the present approach is not limited to formation of a gate of a transistor, but is applicable to any environment wherein very small feature size is desired.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating an electronic device comprising:
   providing a structure over an insulating layer and a substrate, the structure comprising a first body comprising a polysilicon and a second body comprising polysilicon reacted with at least some nickel from a nickel layer disposed over the first body, the second body comprising first, second, and third portions, the first portion being disposed between the second and third portions;
   removing the first portion of the second body, with at least a part of the second and third portions of the second body remaining; and
   removing an area of the first body using the second and third portions of the second body as a mask over a remaining area of the first body,
   wherein a side surface of the second portion is vertically aligned with a side surface of the first body and a side surface of the third portion is vertically aligned with an opposite side surface of the first body,
   further wherein a bottom surface of each of the second portion and the third portion is lower than a bottom surface of the first portion.

2. The method of claim 1 wherein the material of the first body is removed by etching.

3. The method of claim 1 wherein the first portion of the second body is removed by chemical-mechanical polishing.

4. The method of claim 1 wherein the second body is in contact with the first body.

5. The method of claim 1 wherein the material of the first body is removed by etching.

6. The method of claim 5 wherein the first portion of the second body is removed by chemical-mechanical polishing.

7. The method of claim 1, wherein the first portion of the second body is disposed over the first body, the second portion of the second body extends into a first side of the first body and the third portion of the second body extends into a second side of the first body on a side opposite to the first side.

8. The method of claim 7 wherein the first body is polysilicon.

9. The method of claim 7 wherein the second body is a silicide.

10. The method of claim 1, wherein the second body is formed by providing a nickel layer over a polysilicon, and performing a reaction step to diffuse nickel of the nickel layer into exposed top and side portions of the polysilicon to form the first and second portions of the second body.

11. The method of claim 10, wherein the performing the reaction step comprises forming the second body as a nickel silicide with the first portion comprising a top portion of nickel silicide disposed over the first body, and the second portion comprising a side portion of nickel silicide disposed as a side portion extending into the first body.

12. The method of claim 11, wherein the removing the first portion of the second body comprises removing the top portion of nickel silicide such that the side portion of nickel silicide remains.

13. The method of claim 1, wherein the first portion of the second body comprises material from the nickel layer that is unreactant with the first body.

14. The method of claim 1, wherein the diffusing the layer into exposed surfaces of the first body and causing a reaction to portions of the first body is performed inwardly from an exposed top surface and exposed side surfaces of the first body.

15. A method of fabricating a semiconductor device comprising:
providing a substrate;
providing an insulating layer on and in contact with the substrate;
providing a first body on and in contact with the insulating layer;
providing a nickel layer over and in contact with the first body;
forming a second body from the nickel layer and the first body by reacting at least some of the nickel layer with the first body, the second body comprising first, second and third portions, the first portion being between the second and third portions, the second and third portions being vertically aligned with separate side surfaces of the first body and having bottom surfaces lower than a bottom surface of the first portion;
removing the un-reacted nickel;
removing the first portion of the second body, with at least parts of the second and third portions of the second body remaining; and
removing a first portion of the first body using the second and third portions of the second body as a mask over a remaining second portion of the first body.

16. The method of claim 15 and further comprising forming a doped region in the substrate.

17. The method of claim 15 and further comprising removing material of the insulating layer using the second and third portions of the second body as a mask, to expose a portion of the substrate.

18. The method of claim 17 wherein the material of the first body and the material of the insulating layer are removed by etching.

19. The method of claim 17 and further comprising forming a doped region in the exposed portion of the substrate.

20. The method of claims 19 wherein the doped region is formed by implantation.

21. The method of claim 15 wherein the first body is polysilicon.

22. The method of claim 21 wherein the second body is a silicide.

23. The method of claim 22 wherein the silicide is NiSi silicide.

24. The method of claim 15, wherein the second body is formed by providing a nickel layer over the structure, and performing a reaction step to diffuse nickel of the nickel layer into exposed top and side portions of the polysilicon to form the first, second, and third portions of the second body.

25. The method of claim 24, wherein the performing the reaction step comprises forming the second body as a nickel silicide with the first portion comprising a top portion of nickel silicide disposed over the first body, and the second and third portions comprising side portions of nickel silicide disposed as side portions extending into the first body.

26. The method of claim 25, wherein the removing the first portion of the second body comprises removing the top portion of nickel silicide such that the side portions of nickel silicide remains.

27. The method of claim 15, wherein the first portion of the second body comprises material from the layer that is unreactant with the first body.

28. The method of claim 15, wherein the forming of the second body comprises diffusing the nickel layer inwardly from an exposed top surface and exposed side surfaces of the first body.

* * * * *